(12) United States Patent  (10) Patent No.: US 7,758,978 B2
Walsh  (45) Date of Patent: Jul. 20, 2010

(54) CONDUCTIVE COATING FOR REDUCED REFLECTIVITY ON ELECTRONIC DISPLAYS

(75) Inventor: Kevin Walsh, Dawsonville, GA (US)

(73) Assignee: L3 Communications Corporation

( * ) Notice: Subject to any disclaimer, the term of this patent is extended or adjusted under 35 U.S.C. 154(b) by 943 days.

(21) Appl. No.: 11/468,335

(22) Filed: Aug. 30, 2006

(65) Prior Publication Data

US 2008/0053684 A1  Mar. 6, 2008

(51) Int. Cl.
*B32B 9/00* (2006.01)
(52) U.S. Cl. ............ 428/699; 428/689; 428/701; 428/702
(58) Field of Classification Search ........ 428/689, 428/699, 701, 702
See application file for complete search history.

(56) References Cited

U.S. PATENT DOCUMENTS

2006/0023131 A1 * 2/2006 Takano et al. ............ 349/12
2006/0083938 A1 * 4/2006 Kim et al. ............... 428/469

\* cited by examiner

*Primary Examiner*—Gwendolyn Blackwell
(74) *Attorney, Agent, or Firm*—Gardner Groff Greenwald & Villanueva, PC

(57) ABSTRACT

In an optical thin-film arrangement on a transparent optical substrate, such as a display screen, two or more conductive layers are stacked in an alternating fashion with one or more dielectric layers. The conductive layer can include, for example, indium-tin oxide (ITO), and the dielectric layer can include an index-matching material. The conductive layers can be in electrical contact with one another at their peripheries to provide EMI/RFI shielding. A structure having more than one conductive layer can be made to have the same net sheet resistance and thus provide the same degree of shielding as a conventional single-layer conductive coating but with lower reflectivity.

19 Claims, 2 Drawing Sheets

CONDUCTIVE COATING FOR REDUCED REFLECTIVITY ON ELECTRONIC DISPLAYS

BACKGROUND OF THE INVENTION

1. Field of the Invention

The present invention relates generally to electronic displays and, more specifically, to electronic displays with conductive coatings.

2. Description of the Related Art

Many electronic displays have one or more optical coatings or thin films on a glass or similar substrate. Coating the surface of a display screen (e.g., glass) with a conductive material can provide shielding against electromagnetic interference (EMI) and radio frequency interference (RFI), sometimes collectively referred to as EMI/RFI shielding. For example, aircraft cockpit display screens are EMI/RFI shielded to minimize both emitted electromagnetic energy that might interfere with the operation of other instruments and impinging electromagnetic energy that might interfere with the operation of the display instrument itself.

Although a multitude of materials are known in the art for coating transparent optical substrates, the most common conductive material for coating display screens is indium-tin oxide (ITO). In addition to providing EMI/RFI shielding, ITO coatings are used for various other purposes, such as for electrodes in liquid crystal displays and heating and defogging elements in display screens and viewports. Such optical coatings are typically formed by vacuum sputtering or evaporation or similar well-known "thin film technology" methods. The term "thin film," in the context of optics, is used in the art to refer to layers of material having thicknesses on the order of the wavelengths of visible light.

Ambient light reflecting off an EMI/RFI shielding coating hampers viewability of the display during daytime. Anti-reflective coatings are known and can be formed over the shielding (conductive) coating, but a conventional anti-reflective coating does not provide sufficient reflectivity reduction for demanding applications such as cockpit instrument displays. Accordingly, it would be desirable to provide a conductive coating structure for display screens that provides maximal EMI/RFI shielding with minimal reflectivity. It is to the provision of such a coating structure and method for making the structure that the present invention is primarily directed.

SUMMARY OF THE INVENTION

Briefly described, in a first preferred form, the present invention relates to an optical thin-film arrangement on a transparent optical substrate, such as a display screen, in which a plurality of conductive layers are stacked in an alternating fashion with one or more dielectric layers. The conductive layer can comprise, for example, indium-tin oxide (ITO), and the dielectric layer can comprise an index-matching material.

Optionally, the layers can be tuned to transmit or reflect selected wavelengths by selecting materials having suitable indices of refraction and thicknesses. In some embodiments of the invention, all conductive layers can be made of the same material and be of the same thickness, while in other embodiments materials of differing composition or thicknesses can be combined.

Optionally, at least portions of the peripheries of some or all of the conductive layers can be joined together to provide electrical continuity between them. The electrical conductivity of the structure can be controlled by joining the peripheries of selected layers having selected sheet resistances because the net sheet resistance of layers joined at their peripheries is analogous to the net resistance of resistors connected in parallel. For example, a structure comprising three conductive layers, each having a sheet resistance of 12 ohms per square and joined together at their peripheries, has a net sheet resistance of 4 ohms per square. Yet, as has been discovered in accordance with the present invention, three ITO layers having a net sheet resistance of 4 ohms per square advantageously reflects less visible light than a single ITO layer having a sheet resistance of 4 ohms per square. (Note that "ohms per square" is a well-understood term of art, reflecting the fact that area units are immaterial.) In other words, a structure having more than one conductive layer can be made to have the same net sheet resistance and thus provide the same degree of shielding as a conventional single-layer conductive coating but with lower reflectivity.

DETAILED DESCRIPTION

Figure 1:
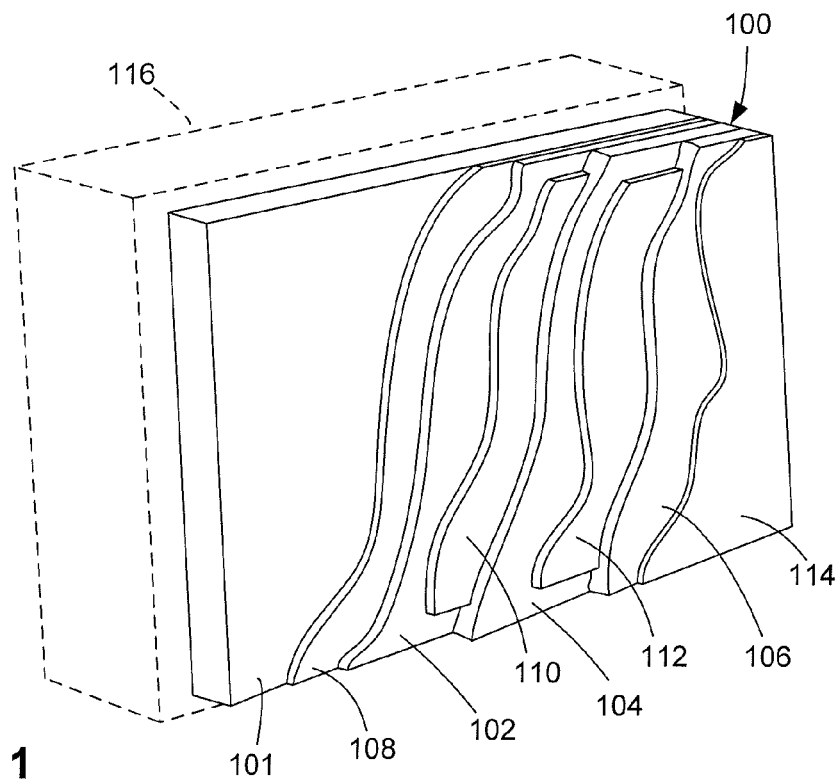
FIG. 1 is a perspective view, partially cut away to show the layers of an optical thin-film structure in accordance with an exemplary embodiment of the invention.
Figure 2:
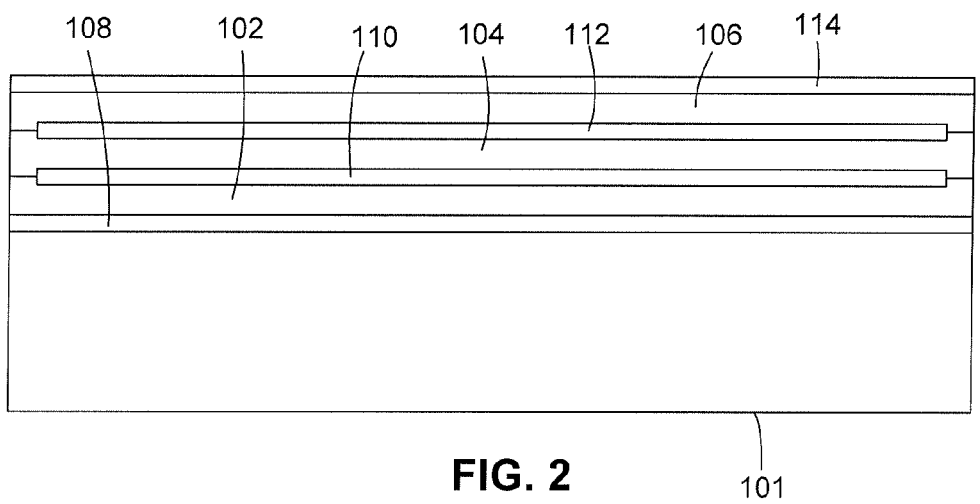
FIG. 2 is an edge view of the exemplary structure of FIG. 1.

As illustrated in FIGS. 1-2 (not to scale), in an exemplary embodiment of the present invention a display screen structure 100 comprises a substrate 101 and alternating optical thin-film conductive layers 102, 104 and 106, and optical thin-film dielectric layers 108, 110, 112 and 114. Although in the exemplary embodiment three conductive layers and four dielectric layers are shown for purposes of illustration, in other embodiments there can be more layers or fewer layers of each type, i.e., any suitable number of conductive layers and any suitable number of dielectric layers.

Display screen structure 100 can be part of an electronic display 116, such as the EMI/RFI-shielded type commonly used with aircraft cockpit instruments. As such, it is desirable for display screen structure 100 to not only provide EMI/RFI shielding but also reflect minimal ambient light so that a viewer can readily see the display during daytime. It may also be desirable for display screen structure 100 to reflect more light of some wavelengths and less light of other wavelengths. For example, it may be desirable for display screen structure 100 to reflect laser light wavelengths to a greater degree than ambient daylight wavelengths. Similarly, for example, it may be desirable for display screen structure 100 to reflect quarter-wavelength green light to a greater extent than other visible light, as is true of some conventional "anti-reflective" or "anti-glare" coatings. As described in further detail below, by selecting the materials and thicknesses of the layers, the present invention provides the ability to tune display screen structure 100 to be more reflective or otherwise responsive to selected wavelengths than other wavelengths.

A notable aspect of the invention is the discovery that a plurality of relatively thin conductive layers can provide at least as good EMI/RFI shielding as a single, much thicker conductive layer, with less reflectivity than an electrically equivalent single thicker layer. To provide EMI/RFI shielding, conductive layers 102, 104 and 106 contact each other at their peripheries so as to provide electrical continuity. (Although not shown for purposes of clarity, they would similarly be in electrical contact with the corresponding periphery or bezel of the shielded housing or similar portion of electronic display 116 or other electronic device in which display screen structure 100 is mounted.) In a display screen structure 100 having a rectangular shape, as in the exemplary embodiment, each of the four sides or edges of conductive layers 102, 104 and 106 is in electrical contact with corresponding sides or edges of the others. In other embodiments having rectangular or other regular geometric shapes, fewer sides can be in electrical contact with each other. For example, a rectangular arrangement in which two opposing sides are in electrical contact with each other but two other opposing sides are not in electrical contact with each other can be used to heat or defog the substrate by means of a supplied voltage. In still other embodiments, the structure can have any other suitable shape in which the layer peripheries (or, alternatively, only portions thereof) are in contact with each other. Also, although in the exemplary embodiment, all of the layers are substantially coextensive with each other, with the middle dielectric layers 110 and 112 being only negligibly smaller in area than the other layers so that conductive layers 102, 104 and 106 can contact each other at their peripheries, in other embodiments some layers can have substantially smaller areas or different shapes or patterns than others.

For example, if each of conductive layers 102, 104 and 106 has a sheet resistance of 12 ohms per square, display screen structure 100 as a whole has a net sheet resistance of 4 ohms per square, because layers attached at their peripheries and separated elsewhere by dielectric layers are electrically analogous to resistors connected in parallel. Yet, as has been discovered in accordance with the present invention, a display screen structure 100 comprising three conductive layers 102, 104 and 106 having a net sheet resistance of 4 ohms advantageously can be less reflective than a single-layer display screen structure (not shown) having a sheet resistance of 4 ohms per square. Stated another way, for a display screen structure comprising a single conductive layer to have a sheet resistance of 4 ohms, it would need to be approximately equal to the total thickness of three conductive layers that each has a sheet resistance of 12 ohms. Generally speaking, as well-understood in the art, a plurality of thin-film optical layers having a given total thickness can be made less reflective than a single thin-film optical layer of the same thickness because the plurality of layers can give rise to destructive interference among those light rays that are 180 degrees out of phase with each other.

The conductive layers can be made of any suitable conductive material. One suitable material is indium-tin oxide (ITO). Doped semiconductor materials may also be suitable. The dielectric layers can likewise be made of any suitable dielectric material. For example, materials used in conventional index-matching optical coatings can be used, such as magnesium fluoride. Although in the exemplary embodiment, each of conductive layers 102, 104 and 106 comprises ITO, and each of dielectric layers 108, 110, 112 and 114 comprises an index-matching material, in other embodiments different conductive layers can be made of different materials, and different dielectric layers can be made of different materials. The layers can be formed in any suitable manner and have any suitable thickness within the general range characteristic of thin-film technology, as understood by persons skilled in the art. Different conductive layers can have different thicknesses, and different dielectric layers can have different thicknesses. It is contemplated that conventional manufacturing methods, such as vacuum magnetron sputtering or other coating or evaporation methods, can be used to form the layers. It is also contemplated that a layer can be applied to some other substrate, which is then incorporated into (e.g., by bonding) the stack of layers. The term "layer" as used herein is not itself intended to imply any specific manufacturing method, step or material.

Figure 3:
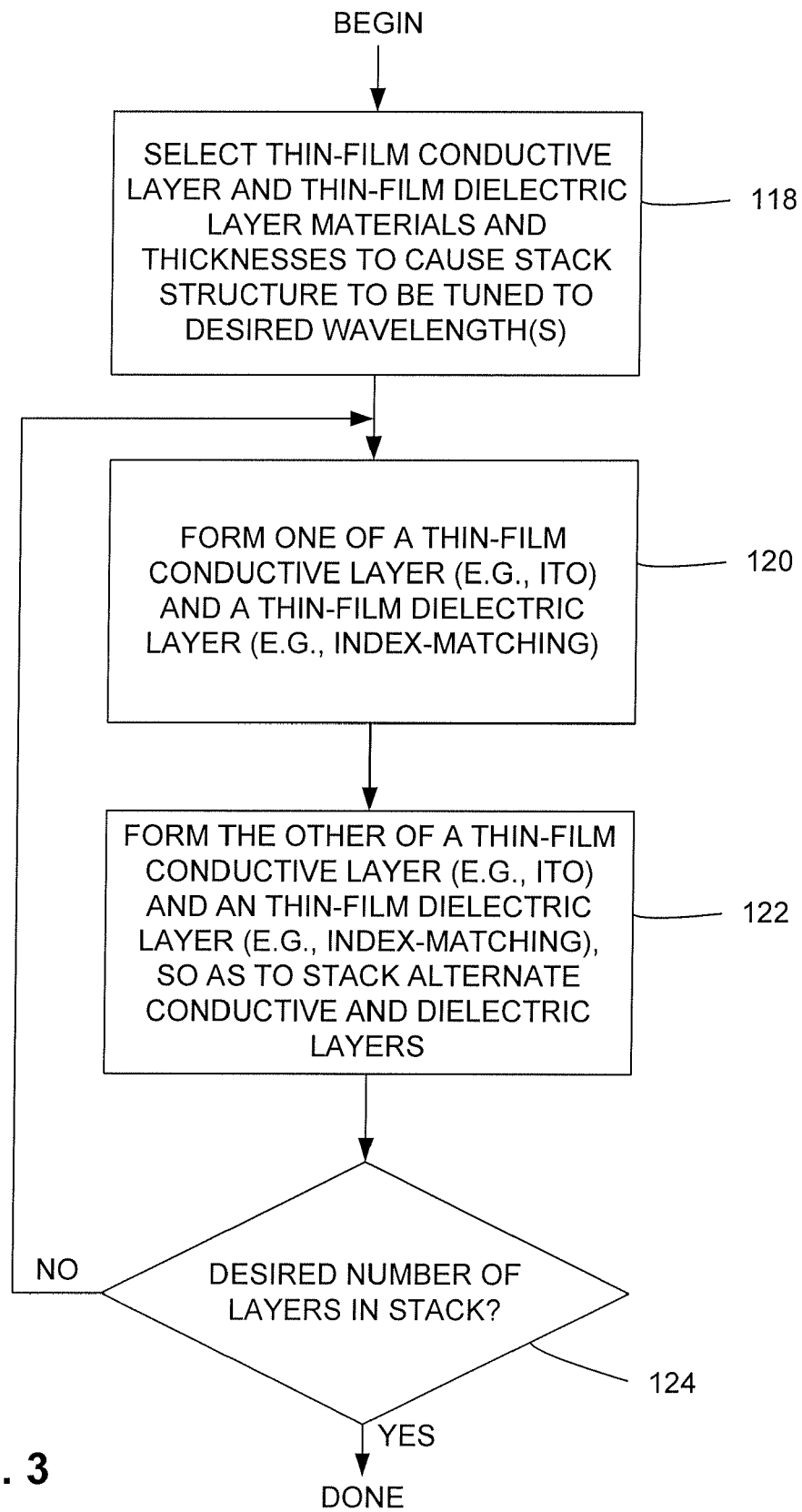
FIG. 3 is a flow diagram illustrating an exemplary method for making the structure of FIGS. 1-2.

As illustrated in FIG. 3, a method for making a structure such as display screen structure 100 (FIGS. 1-2) can comprise steps 118, 120, 122 and 124. At step 118, a material and thickness is selected for each conductive layer and each dielectric layer. (Accordingly, the number of conductive layers and number of dielectric layers is also selected.) Although it is contemplated in accordance with the exemplary embodiment of the invention, where the method is used to make an EMI/RFI-shielded display screen structure, that the materials, thicknesses and number of layers will be selected based upon their conductivity (or lack thereof) and index of refraction so as to minimize reflection of visible light and maximize shielding, in other embodiments any other suitable selection criteria can be employed so as to control reflection of selected wavelengths in the desired manner.

In the exemplary embodiment, layers 102, 104 and 106 can comprise ITO, and layers 108, 110, 112 and 114 can comprise an index-matching material that matches the indices of refraction of the materials with which they interface. Thus, for example, the outer dielectric layer 114, which is exposed to the air, can comprise magnesium fluoride, as that material, having an index of refraction of about 1.4, is known to be suitable for matching air, which has an index of refraction of one, to ITO, which has an index of refraction in the range of 1.8 to 2.0. Similarly, dielectric layers 110 and 112, which are sandwiched between conductive layers 102 and 104 and conductive layers 104 and 106, respectively, can comprise materials known to be suitable for interfacing high index of refraction materials such as ITO. Dielectric layer 108, which is sandwiched between substrate 101 and conductive layer 102, can comprise a material known to be suitable for matching the substrate material (e.g., glass) to ITO. As described above, although in the exemplary embodiment three conductive (ITO) layers 102, 104 and 106 and four dielectric (index-matching) layers are selected at step 118, in other embodiments any other suitable number of layers can be selected.

At step 120, a layer of one of the two types (i.e., either a conductive layer or a dielectric layer) is formed upon substrate 101, and at step 122 another layer of the other of the two types is formed upon the previously formed layer. As indicated by step 124, successive layers are built up or stacked in this manner until a selected number of layers is formed. In the exemplary embodiment, at step 120 dielectric (index-matching) layer 108 is formed upon substrate 101 by, for example, vacuum deposition, so as to coat it with the material. At step 122, conductive (ITO) layer 102 is formed upon layer 108 using the same or other suitable method. As there are more layers to be formed, steps 120 and 122 are repeated to successively form layers 110, 104, 112, 106 and 114. The method is complete when outer layer 114 has been formed. As noted above, in other embodiments other steps and other types of layers can be included. The steps illustrated in FIG. 3 are intended to be exemplary only. The steps can be performed in any suitable order.

It will be apparent to those skilled in the art that various modifications and variations can be made to this invention without departing from the spirit or scope of the invention. Thus, it is intended that the present invention covers the modifications and variations of this invention provided that they come within the scope of any claims and their equivalents. With regard to the claims, no claim is intended to invoke the sixth paragraph of 35 U.S.C. Section 112 unless it includes the term "means for" followed by a participle.

What is claimed is:

1. An optical structure, comprising:
   a substrate transparent to one or more selected wavelengths of electromagnetic energy; and
   a plurality of thin-film layers essentially transparent to the one or more selected wavelengths, at least one of the layers in contact with the substrate, the thin-film layers comprising:
   a plurality of thin-film conductive layers; and
   a thin-film dielectric layer sandwiched between and around the thin-film conductive layers, wherein at least one thin-film dielectric layer comprises magnesium fluoride.

2. The optical structure claimed in claim 1, wherein the substrate comprises an element of a display screen.

3. The optical structure claimed in claim 1, wherein the thin-film layers comprise coatings by vacuum deposition.

4. The optical structure claimed in claim 1, wherein the thin-film conductive layers comprise indium-tin oxide (ITO).

5. The optical structure claimed in claim 1, wherein the at least one thin-film dielectric layer that comprises magnesium fluoride is an index-matching layer for matching air.

6. The optical structure claimed in claim 1, wherein the thin-film layers comprise a plurality of thin-film dielectric layers, each sandwiched between thin-film conductive layers in an alternating arrangement.

7. The optical structure claimed in claim 6, wherein the thin-film conductive layers comprise indium-tin oxide (ITO).

8. The optical structure claimed in claim 6, wherein at least one thin-film dielectric layer is an index-matching layer to at least one thin-film conductive layer.

9. The optical structure claimed in claim 8, wherein the thin-film conductive layers comprise indium-tin oxide (ITO).

10. The optical structure claimed in claim 6, wherein each of the plurality of thin-film layers has a periphery, and at least a portion of the periphery of each of the thin-film conductive layers is in contact with at least a portion of the periphery of another of the thin-film conductive layers.

11. The optical structure claimed in claim 10, wherein the periphery of each of the thin-film conductive layers is rectangular, and at least one edge of the periphery of each of the thin-film conductive layers is in contact with at least a corresponding edge of the periphery of another of the thin-film conductive layers.

12. The optical structure claimed in claim 11, wherein each of four edges of the periphery of each of the thin-film conductive layers is in contact with one of four corresponding edges of the periphery of another of the thin-film conductive layers.

13. The optical structure claimed in claim 12, wherein the thin-film conductive layers comprise indium-tin oxide (ITO).

14. The optical structure claimed in claim 1, wherein the at least one thin-film dielectric layer is an index-matching layer for matching the substrate.

15. An optical structure, comprising:
    a substrate transparent to one or more selected wavelengths of electromagnetic energy; and
    a plurality of thin-film layers essentially transparent to the one or more selected wavelengths, at least one of the layers in contact with the substrate, the thin-film layers comprising:
    a plurality of thin-film dielectric layers, wherein at least one thin-film dielectric layer comprises magnesium fluoride;
    a plurality of thin-film conductive layers sandwiched between the thin-film dielectric layers, wherein the plurality of thin-film conductive layers comprises indium-tin oxide (ITO); and
    wherein each of the thin-film conductive layers is in contact with at least one corresponding edge of the periphery of another of the thin-film conductive layers.

16. The optical structure claimed in claim 15, wherein the at least one thin-film dielectric layer index-matching layer comprises magnesium fluoride is an index-matching layer for air.

17. The optical structure claimed in claim 15, wherein at least one thin-film dielectric layer is an index-matching layer for matching the substrate.

18. The optical structure claimed in claim 15, wherein the thin-film layers comprise a plurality of thin-film dielectric layers, each sandwiched between thin-film conductive layers in an alternating arrangement.

19. The optical structure claimed in claim 18, wherein at least one thin-film dielectric layer is an index-matching layer to at least one thin-film conductive layer.

* * * * *